US012330932B2

(12) United States Patent
Zhao et al.

(10) Patent No.: US 12,330,932 B2
(45) Date of Patent: Jun. 17, 2025

(54) MEMS MICROPHONE

(71) Applicant: AAC ACOUSTIC TECHNOLOGIES (SHENZHEN) CO., LTD., Shenzhen (CN)

(72) Inventors: Zhuanzhuan Zhao, Shenzhen (CN); Zhengyu Shi, Shenzhen (CN); Kaijie Wang, Shenzhen (CN); Linlin Wang, Shenzhen (CN); Rui Zhang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/923,607

(22) PCT Filed: Jun. 7, 2022

(86) PCT No.: PCT/CN2022/097266
§ 371 (c)(1),
(2) Date: Nov. 7, 2022

(87) PCT Pub. No.: WO2023/206721
PCT Pub. Date: Nov. 2, 2023

(65) Prior Publication Data
US 2025/0042722 A1    Feb. 6, 2025

(30) Foreign Application Priority Data

Apr. 25, 2022    (CN) .......................... 202220983244.6

(51) Int. Cl.
*B81B 3/00*    (2006.01)
*H04R 7/18*    (2006.01)
*H04R 19/04*    (2006.01)

(52) U.S. Cl.
CPC ............. *B81B 3/0072* (2013.01); *H04R 7/18* (2013.01); *H04R 19/04* (2013.01);
(Continued)

(58) Field of Classification Search
CPC .......... B81B 3/0072; B81B 2201/0257; B81B 2203/0127; B81B 2203/0315;
(Continued)

(56) References Cited

U.S. PATENT DOCUMENTS

2002/0067663 A1* 6/2002 Loeppert ............... B81B 3/0072
367/181
2009/0309171 A1* 12/2009 Schrank ............... B81B 3/0072
257/415
(Continued)

FOREIGN PATENT DOCUMENTS

CN          108235202 A  *  6/2018   ........... B81B 3/0072
WO     WO-0215636 A2  *  2/2002   ........... B81B 3/0072

*Primary Examiner* — Angelica M McKinney
(74) *Attorney, Agent, or Firm* — Wiersch Law Group

(57) ABSTRACT

The present disclosure discloses a Micro-Electro-Mechanical System (MEMS) microphone including a substrate including a back cavity; a capacitive system arranged on the substrate, the capacitive system including a back plate and a diaphragm opposite to the back plate, the diaphragm located on a side of the back plate close to the substrate; a support member located between the diaphragm and the back plate; a blocking portion arranged on a side of the back plate facing the diaphragm; wherein the diaphragm includes a vibration portion and a fixing portion surrounding the vibration portion and fixed to the substrate, the vibration portion and the back plate are fixedly connected by the support member, a projection of the blocking portion along a vibration direction of the diaphragm is located within the vibration portion of the diaphragm. Compared with the (Continued)

related art, MEMS microphone disclosed by the present disclosure has a high signal-to-noise ratio.

6 Claims, 5 Drawing Sheets

(52) U.S. Cl.
CPC .............. *B81B 2201/0257* (2013.01); *B81B 2203/0127* (2013.01); *B81B 2203/0315* (2013.01); *B81B 2203/0353* (2013.01); *H04R 2201/003* (2013.01); *H04R 2410/03* (2013.01)

(58) Field of Classification Search
CPC ............ B81B 2203/0353; B81B 3/007; B81B 7/0032; B81B 7/0058; B81B 7/0077; B81B 2201/0235; B81B 2207/012; B81B 2207/09; B81B 2207/092; B81B 2207/096; B81B 7/0064; B81B 3/001; B81B 3/0051; B81B 2203/019; H04R 7/18; H04R 19/04; H04R 2201/003; H04R 2410/03; H04R 7/04; H04R 7/20; H04R 2207/021; H04R 19/005; H04R 1/04; H04R 1/2807; H04R 1/342; H04R 1/083; H04R 17/02; H04R 17/10; H04R 19/016; H04R 2201/02; H04R 2217/00; H04R 2201/029; H04R 1/222; H04R 7/16; H04R 1/28; H04R 31/003; H04R 7/06; H04R 9/08; H04R 1/02; H04R 17/00; H04R 2217/03; B33Y 80/00; B33Y 10/00; B22F 10/28; B81C 1/00269; B81C 1/00888; B81C 2201/034; B81C 2203/0118; B81C 2203/032; B81C 2203/0792; B81C 1/00182; H03H 3/02; H10N 30/2043; H10N 30/872
See application file for complete search history.

(56) References Cited

U.S. PATENT DOCUMENTS

2012/0319174 A1\* 12/2012 Wang .................. H04R 19/005
257/254
2019/0210866 A1\* 7/2019 Chen ..................... B81B 3/0072

\* cited by examiner

MEMS MICROPHONE

FIELD OF THE PRESENT DISCLOSURE

The present disclosure relates to acoustic-electro conversion technologies, in particular to a micro-electro-mechanical system (MEMS) microphone.

DESCRIPTION OF RELATED ART

With rapid developments of the mobile communication technology in recent years, mobile communication devices, such as portable phones, internet-enabled portable phones, personal digital assistants and other devices for communications in dedicated networks, are used more and more. A microphone, especially a MEMS microphone, is one of the most important components used in these devices.

A micro-electro-mechanical system (MEMS) microphone is an electroacoustic transducer produced by micro-mechanical technology, which has a small size, an excellent frequency response characteristic, a low noise, etc. As electronic devices are becoming smaller and thinner, MEMS microphones are increasingly and widely used in these devices.

A MEMS microphone in the related art includes a substrate with a back cavity and a capacitor system arranged on the substrate, the capacitor system includes a back plate and a diaphragm arranged opposite to the back plate, an outer edge of the diaphragm is entirely or partially connected to the substrate, such a structure limits the sensitivity of the MEMS microphone to a certain extent, thereby reducing the signal-to-noise ratio.

Thus, it is necessary to provide a MEMS microphone to solve the problem.

SUMMARY OF THE DISCLOSURE

An objective of the present disclosure is to provide a MEMS microphone with a high signal-to-noise ratio.

In order to achieve the objective mentioned above, the present disclosure discloses a MEMS microphone, including: a substrate including a back cavity; a capacitive system arranged on the substrate, the capacitive system including a back plate and a diaphragm opposite to the back plate, the diaphragm located on a side of the back plate close to the substrate; a support member located between the diaphragm and the back plate; and a blocking portion arranged on a side of the back plate facing the diaphragm; wherein the diaphragm includes a vibration portion and a fixing portion surrounding the vibration portion and fixed to the substrate, the vibration portion and the back plate are fixedly connected by the support member, a projection of the blocking portion along a vibration direction of the diaphragm is located within the vibration portion of the diaphragm.

Further, the vibration portion and the fixing portion are spaced apart from each other by a slit.

Further, the blocking portion is a continuous annular structure.

Further, the blocking portion is provided with a gap.

Further, the back plate includes a body portion provided with sound holes and an edge portion surrounding an outer periphery of the body portion, and the blocking portion is located at the edge portion of the back plate.

Further, the blocking portion and the back plate are configured as an integrated structure.

Further, the support member is connected to a center of the vibration portion of the diaphragm.

Further, the support member and the back plate are configured as an integrated structure.

Further, the support member is made of insulating materials.

Further, the support member is in a cylinder shape.

BRIEF DESCRIPTION OF THE DRAWINGS

Many aspects of the exemplary embodiment can be better understood with reference to the following drawings. The components in the drawings are not necessarily drawn to scale, the emphasis instead being placed upon clearly illustrating the principles of the present disclosure.

DETAILED DESCRIPTION OF THE EXEMPLARY EMBODIMENTS

Figure 1:
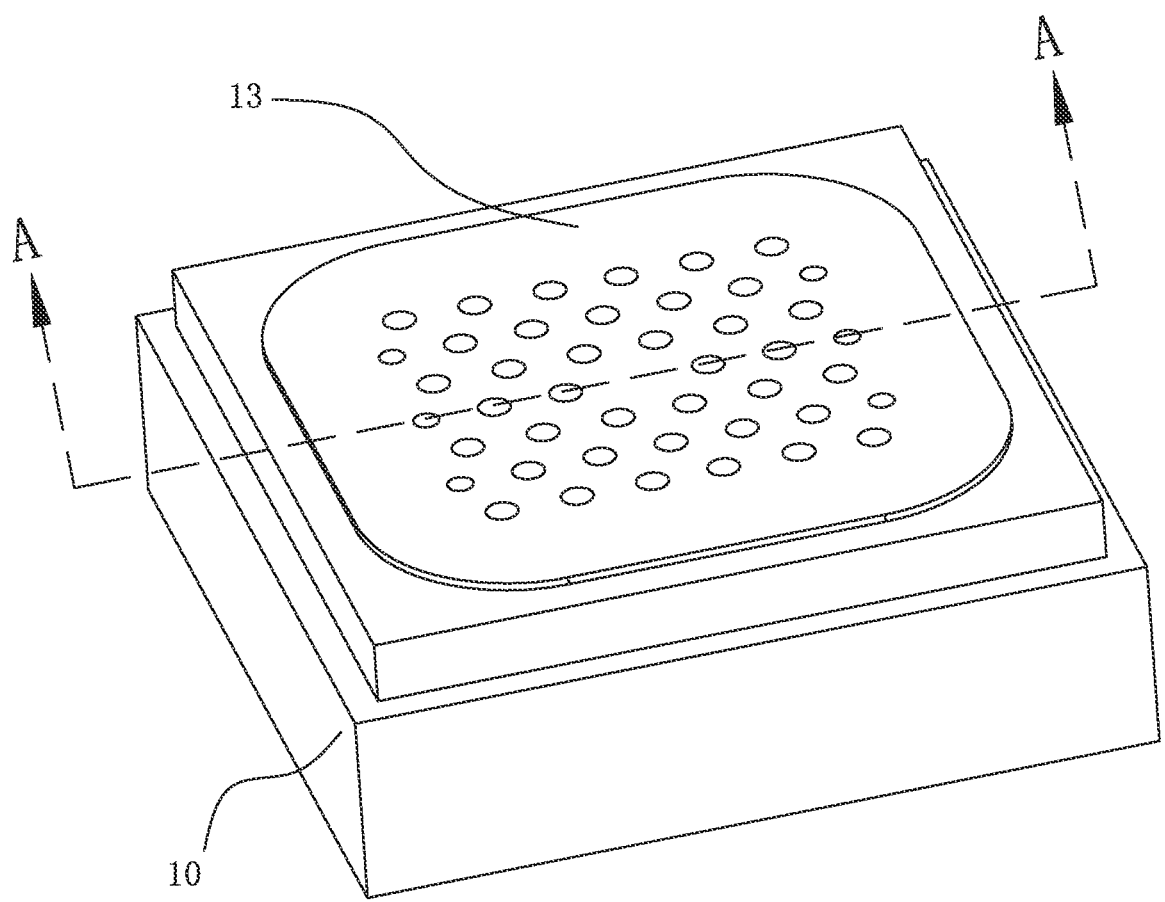
FIG. 1 is an isometric view of a MEMS microphone in accordance with a first embodiment.
Figure 2:
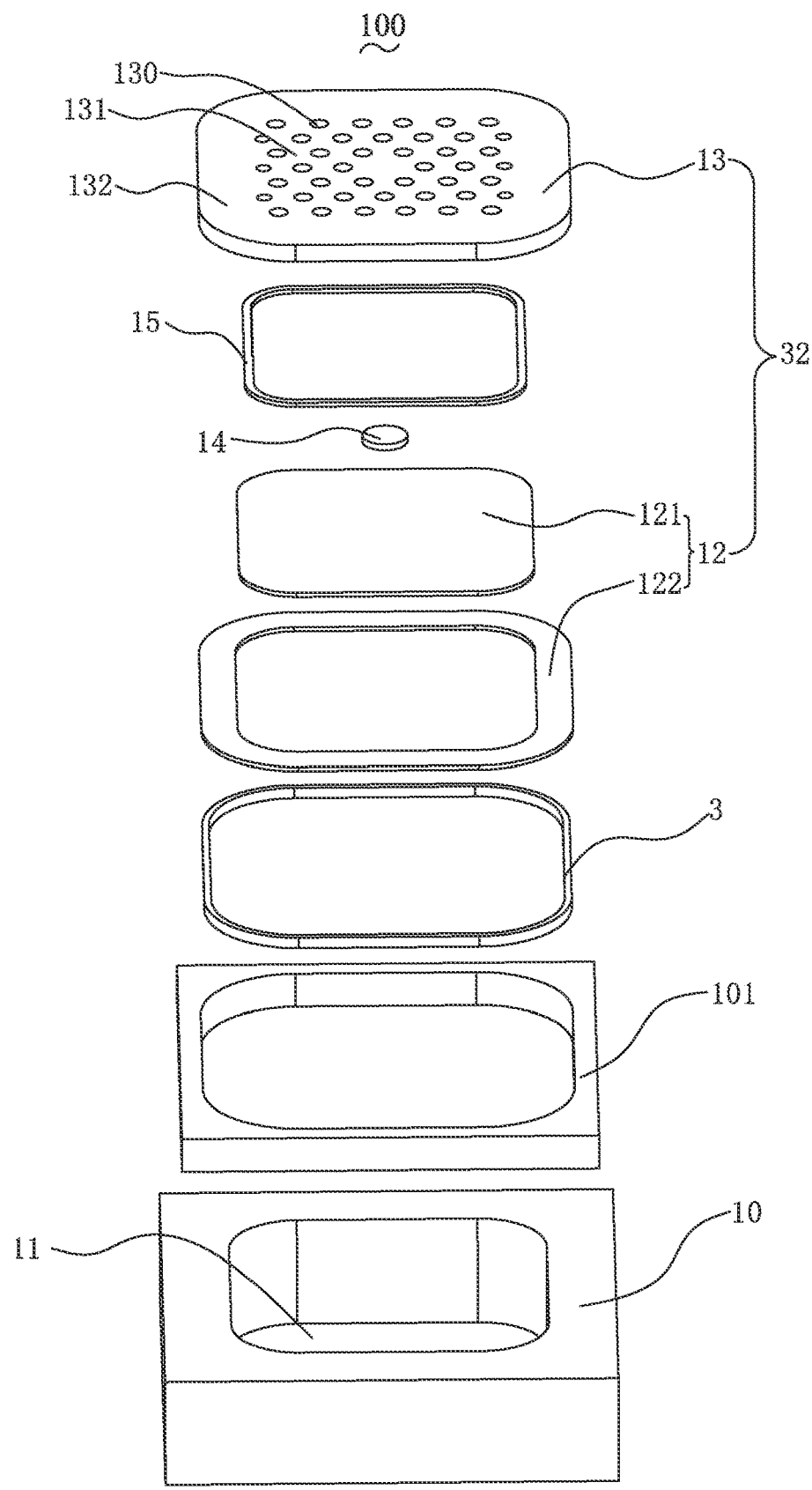
FIG. 2 is an exploded view of the MEMS microphone in accordance with the first embodiment.
Figure 3:
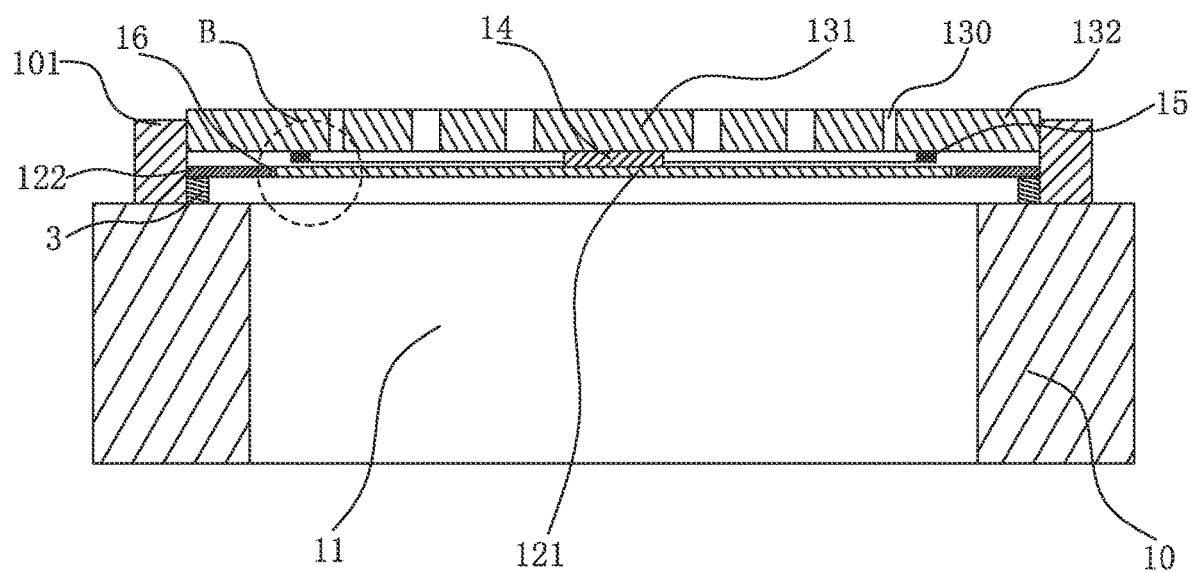
FIG. 3 is a cross-sectional view of the MEMS microphone taken along line AA in FIG. 1.
Figure 4:
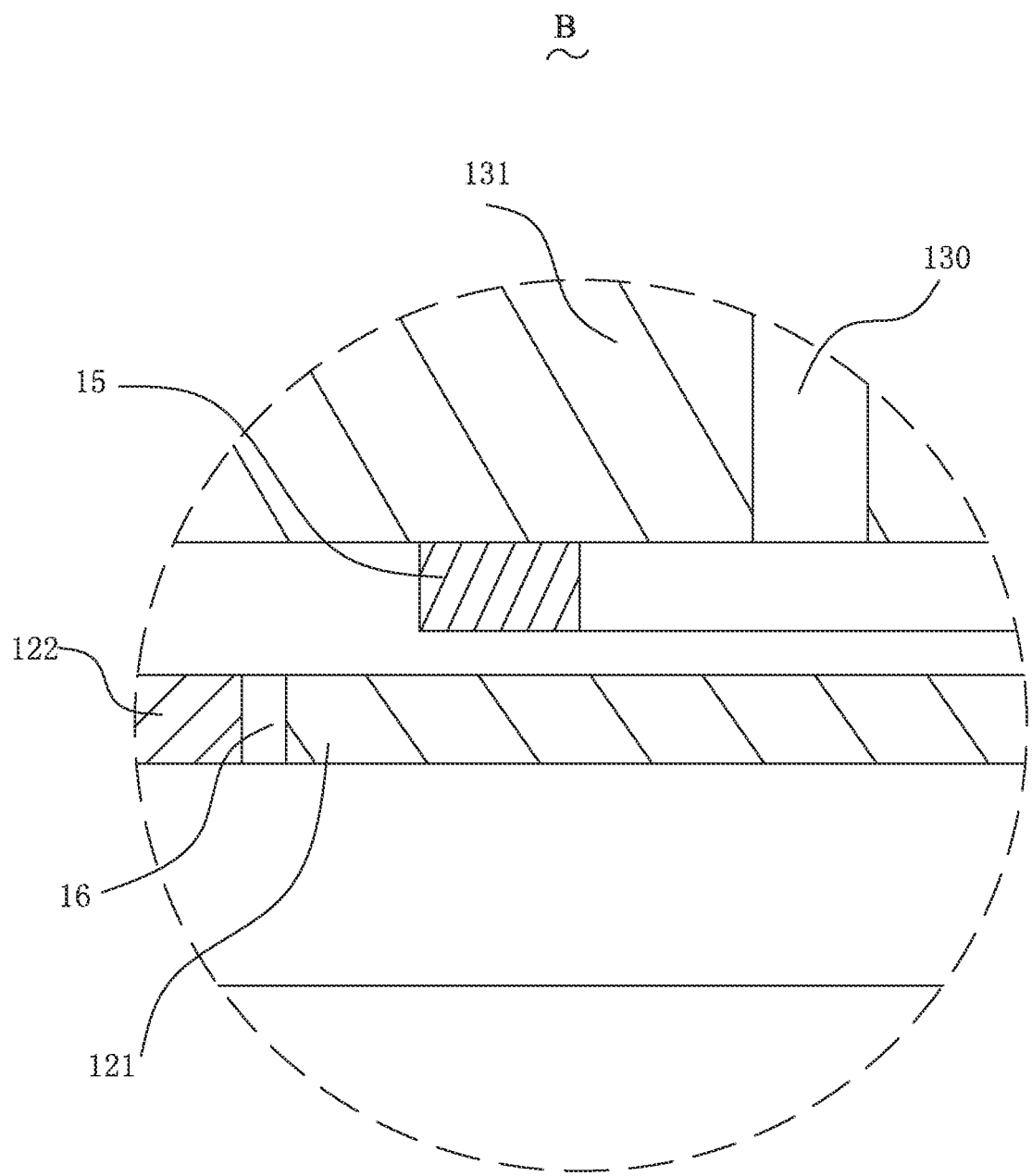
FIG. 4 is an enlarged structural schematic view of B in FIG. 3.

The present disclosure will hereinafter be described in detail with reference to exemplary embodiments. To make the technical problems to be solved, and technical solutions and beneficial effects of the present disclosure more apparent, the present disclosure is described in further detail together with the figure and the embodiment. It should be understood the specific embodiment described hereby is only to explain the disclosure, not intended to limit the disclosure.

First Embodiment

Referring to FIGS. 1-4, this embodiment provides a MEMS microphone 100, including a substrate 10 with a back cavity 11 and a capacitive system 32 arranged on the substrate 10. The capacitive system 32 includes a back plate 13 and a diaphragm 12 opposite to the back plate 13, the diaphragm 12 is located on a side of the back plate 13 close to the substrate 10. When the sound pressure acts on the diaphragm 12, there is a pressure difference between the two sides of the diaphragm 12 facing the back plate 13 and the diaphragm 12 away from the back plate 13, so that the diaphragm 12 moves closer to the back plate 13 or away from the back plate 13, thereby causing the diaphragm 12 to move, the change of the capacitance with the back plate 13 realizes the conversion of the sound signal to the electrical signal.

The back plate 13 includes a body portion 131 provided with sound holes 130 and an edge portion 132 surrounding an outer periphery of the body portion 131. The MEMS microphone 100 includes a connecting portion 101 fixed with the substrate 10, the connecting portion 101 forms a cavity for accommodating the capacitive system 32, the edge portion 132 of the back plate 13 is connected to an inner side of the connecting portion 101 to be fixed to the substrate 10.

The diaphragm 12 includes a vibration portion 121 and a fixing portion 122 surrounding the vibration portion 121, the fixing portion 122 is fixed to the substrate 10 by an insulating layer 3 disposed on the substrate 10, and the insulating layer 3 is located inside the connecting portion 101. In addition, the vibration portion 121 and the fixing portion 122 are spaced apart from each other by a slit 16. The slit 16 is used to adjust the low attenuation value of the MEMS microphone 100, thereby adjusting the performance of the MEMS microphone 100. The vibration portion 121 is fixedly connected to the back plate 13 by a support member 14 disposed between the vibration portion 121 of the diaphragm 12 and the body portion 131 of the back plate 13, so that the vibration portion 121 is suspended between the back plate 13 and the substrate 10. Therefore, the residual stress of the diaphragm 12 is zero, the sensitivity of the diaphragm 12 is improved, and the signal-to-noise ratio is increased.

In addition, the support member 14 is made of insulating materials, the support member 14 and the back plate 13 are configured as an integrated structure, the support member 14 can also be an independent component. Preferably, the support member 14 is fixedly connected with a center of the vibration portion 121, which can reduce unnecessary deflection of the diaphragm 12 and improve the reliability of the MEMS microphone 100. The shape of the support member 14 is not limited, and may be in a cylinder shape, a cube shape or other shapes.

In the present embodiment, the back plate 13 is further provided with a blocking portion 15 on a side facing the diaphragm 12. A projection of the blocking portion 15 along a vibration direction 121 of the diaphragm 12 is located at the vibration portion 121 of the diaphragm 12. Preferably, the blocking portion 15 is located at the edge portion 132 of the back plate 13. When no voltage is applied, the diaphragm 12 is not in contact with the blocking portion 15 of the back plate 13. After the voltage is applied, the diaphragm 12 and the blocking portion 15 of the back plate 13 are attached together. The MEMS microphone 100 with this structure can make the residual stress of the diaphragm to be zero, and the sensitivity of the diaphragm 12 is no longer limited by the thickness and stress of the diaphragm 12.

It should be noted that the external sound can either be transmitted to the diaphragm 12 through the back cavity 11, or can be transmitted to the diaphragm 12 through the sound holes 130 of the back plate 13. This embodiment is mainly aimed at the situation that the external sound is transmitted to the diaphragm 12 through the sound holes 130 of the back plate 13. Specifically, the blocking portion 15 is a continuous annular structure, and external sound is transmitted from the sound holes 130 of the back plate 13 to the diaphragm 12, thereby causing the diaphragm 12 to vibrate. At the same time, the diaphragm 12 and the blocking portion 15 of the back plate 13 are attached together, and the slit 16 does not work, thereby improving the performance of the MEMS microphone 100 with this structure.

Second Embodiment

Figure 5:
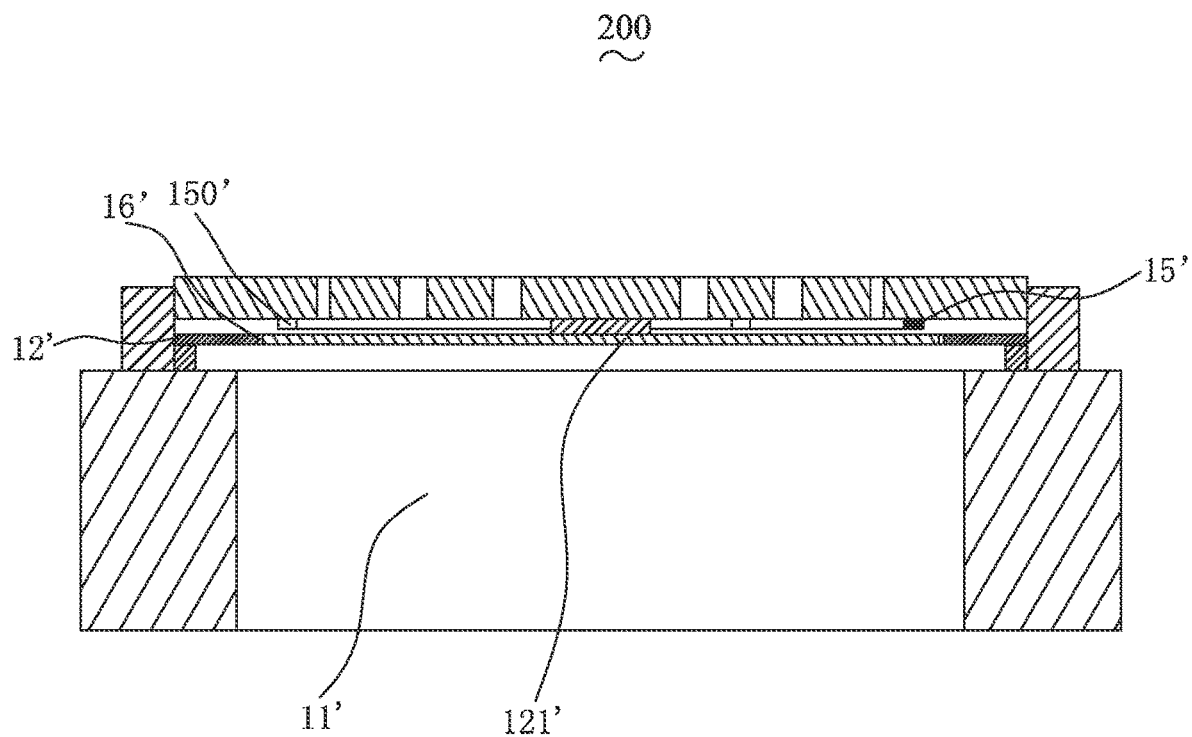
FIG. 5 is a cross-sectional view of the MEMS microphone provided in a second embodiment.

Referring to FIG. 5, a MEMS microphone is provided by the second embodiment. The second embodiment is mainly made to adapt to the situation that the external sound is transmitted to the diaphragm 12' through the back cavity 11', the distinction between the second embodiment and the first embodiment is that, the blocking portion 15' is provided with a gap 150', the blocking portion 15' is not a continuous annular structure.

Specifically, the external sound is directly transmitted to the diaphragm 12' through the back cavity 11', and can also be transmitted to the vibration portion 121' of the diaphragm 12' through the slit 16' and the gap 150' of the blocking portion 15'. The size of the slit 16' is adjusted to adjust the low attenuation value, thereby adjusting the performance of the MEMS microphone 200.

Compared with the related art, the above-mentioned MEMS microphone 100 connects the vibration part 121 of the diaphragm 12 to the back plate 13 by the support member 14, the edge of the vibration portion 121 of the diaphragm 12 is suspended when not in operation, and the edge of the vibration portion 121 is attached to the blocking portion 15 during operation, therefore, the residual stress of the diaphragm 12 to be zero, and the sensitivity of the diaphragm 12 is no longer limited by the thickness and stress of the diaphragm 12, which improves the sensitivity and signal-to-noise ratio of the MEMS microphone 100, and further improves the acoustic performance of the MEMS microphone.

It is to be understood, however, that even though numerous characteristics and advantages of the present exemplary embodiment have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms where the appended claims are expressed.

What is claimed is:

1. A Micro-Electro-Mechanical System (MEMS) microphone, comprising:
   a substrate comprising a back cavity;
   a capacitive system arranged on the substrate, comprising a back plate and a diaphragm opposite to the back plate, the diaphragm located on a side of the back plate close to the substrate;
   a support member located between the diaphragm and the back plate; and
   a blocking portion with a continuous annular structure arranged on a side of the back plate facing the diaphragm; wherein
   the diaphragm comprises a vibration portion and a fixing portion surrounding the vibration portion and fixed to the substrate, the vibration portion and the fixing portion are spaced apart from each other by a slit, the vibration portion and the back plate are fixedly connected by the support member, a projection of the blocking portion along a vibration direction of the diaphragm is located within the vibration portion of the diaphragm, the back plate comprises a body portion with sound holes and an edge portion surrounding an outer periphery of the body portion, and the blocking portion is located at the edge portion of the back plate,
   when no voltage is applied, the diaphragm is not in contact with the blocking portion of the back plate; after the voltage is applied, the diaphragm and the blocking portion of the back plate are attached together.

2. The MEMS microphone as described in claim 1, wherein the blocking portion and the back plate are configured as an integrated structure.

3. The MEMS microphone as described in claim 1, wherein the support member is connected to a center of the vibration portion of the diaphragm.

4. The MEMS microphone as described in claim 1, wherein the support member and the back plate are configured as an integrated structure.

5. The MEMS microphone as described in claim 1, wherein the support member is made of insulating materials.

6. The MEMS microphone as described in claim 1, wherein the support member is in a cylinder shape.

\* \* \* \* \*